(12) United States Patent
Tanabe et al.

(10) Patent No.: US 8,004,657 B2
(45) Date of Patent: Aug. 23, 2011

(54) EXPOSURE APPARATUS, CONTROL METHOD FOR THE SAME, AND DEVICE MANUFACTURING METHOD

(75) Inventors: Masayuki Tanabe, Utsunomiya (JP); Yutaka Watanabe, Shioya-gun (JP); Shigeru Terashima, Utsunomiya (JP); Mika Kanehira, Sendai (JP)

(73) Assignee: Canon Kabushiki Kaisha, Tokyo (JP)

( * ) Notice: Subject to any disclaimer, the term of this patent is extended or adjusted under 35 U.S.C. 154(b) by 815 days.

(21) Appl. No.: 11/677,241

(22) Filed: Feb. 21, 2007

(65) Prior Publication Data

US 2007/0202423 A1 Aug. 30, 2007

(30) Foreign Application Priority Data

Feb. 28, 2006 (JP) ................... 2006-053804

(51) Int. Cl.
*F21V 9/04* (2006.01)
*G03B 27/32* (2006.01)
*G03B 27/42* (2006.01)
*G03B 27/52* (2006.01)
*G03B 27/54* (2006.01)

(52) U.S. Cl. ............... 355/67; 355/30; 355/53; 355/77; 359/359

(58) Field of Classification Search .............. 355/30, 355/53, 66–67, 77; 359/884, 359–361; 427/495–496; 250/492.1–492.2; 430/66
See application file for complete search history.

(56) References Cited

U.S. PATENT DOCUMENTS

| | | | |
|---|---|---|---|
| 5,429,730 A * | 7/1995 | Nakamura et al. | 204/192.34 |
| 5,835,560 A | 11/1998 | Amemiya et al. | 378/34 |
| 6,449,086 B1 | 9/2002 | Singh | |
| 6,533,952 B2 * | 3/2003 | Klebanoff et al. | 216/67 |
| 6,721,032 B2 | 4/2004 | Hasegawa et al. | 355/30 |
| 6,724,462 B1 | 4/2004 | Singh et al. | |
| 6,738,188 B2 | 5/2004 | Singh | |
| 6,750,946 B2 | 6/2004 | Tanaka et al. | 355/30 |
| 6,867,843 B2 | 3/2005 | Ogushi et al. | 355/30 |
| 6,954,255 B2 | 10/2005 | Hasegawa et al. | 355/30 |
| 2002/0051124 A1 * | 5/2002 | Banine et al. | 355/53 |
| 2005/0109278 A1 * | 5/2005 | Liang et al. | 118/723 FE |
| 2007/0040999 A1 * | 2/2007 | Wilhelmus Van Herpen et al. | 355/30 |
| 2007/0097342 A1 | 5/2007 | Gomei et al. | 355/53 |
| 2007/0202423 A1 | 8/2007 | Tanabe et al. | 430/66 |

FOREIGN PATENT DOCUMENTS

JP 2001-059901 3/2001

* cited by examiner

*Primary Examiner* — Hung Henry Nguyen
*Assistant Examiner* — Colin Kreutzer
(74) *Attorney, Agent, or Firm* — Fitzpatrick, Cella, Harper & Scinto

(57) ABSTRACT

An exposure apparatus that includes a chamber in which an optical element, including a capping layer, is arranged, and that exposes a substrate to exposure light via the optical element. The apparatus includes a supply unit configured to supply a material into the chamber and a providing unit configured to provide electromagnetic waves to the capping layer. The apparatus is configured so that the electromagnetic waves provided by the providing unit cause a photochemical reaction of the material, to grow a layer on the capping layer, with at least one of a condition of supply of the material by the supply unit and a condition of provision of the electromagnetic waves by the providing unit being changed in accordance with each position of the capping layer, based on information of a decrease in an amount of the capping layer at each position, so as to repair the capping layer.

20 Claims, 6 Drawing Sheets

EXPOSURE APPARATUS, CONTROL METHOD FOR THE SAME, AND DEVICE MANUFACTURING METHOD

This application claims the benefit of Japanese Patent Application No. 2006-053804, filed on Feb. 28, 2006, which is hereby incorporated by reference herein in its entirety.

BACKGROUND OF THE INVENTION

1. Field of the Invention

The present invention relates to an exposure apparatus comprising a chamber where an optical element having a capping layer is arranged, a control method for the exposure apparatus, and a device manufacturing method.

2. Description of the Related Art

Conventionally, as a lithography method to manufacture fine semiconductor devices, such as semiconductor memories and logic circuits, reduction projection exposure using ultraviolet rays has been performed. However, as the integration density of the semiconductor devices increases, the development of a technique has become a matter of great urgency, which can obtain a resolution with a minimum line width of 70 nm or less, which conventional photolithography arrangements employing ultraviolet light cannot achieve.

Recently, to transfer a very fine circuit pattern onto a photoresist, a photolithography technique that employs EUV (Extreme Ultraviolet) light having a shorter wavelength of 11 nm to 15 nm, to replace ultraviolet rays, has been developed. The EUV lithography technique is expected to be promising as a technique that can obtain a resolution with a minimum line width of 70 nm or less.

In the EUV region, which covers a wavelength of 11 nm to 15 nm, all substances have strong absorption. In this region, an optical system including a transmissive optical element, which utilizes refraction as in lithography employing ultraviolet light as the exposure light, cannot be employed. Hence, an optical system comprising a reflective optical element, such as a thin film filter or mirror, is employed. The surface of such a reflective optical element has a multi-layer film obtained by alternately stacking two types of substances having different optical constants. For example, alternate stacking of molybdenum (Mo) and silicon (Si) on the surface of a glass substrate polished into an accurate shape can form the multi-layer film. Regarding the thicknesses of the respective layers, for example, each Mo layer has a thickness of about 3 nm, and each Si layer has a thickness of about 4 nm.

A gas component present in the atmosphere also absorbs light within the EUV region, which covers a wavelength of 11 nm to 15 nm, to attenuate the light greatly. Thus, the interior of the exposure apparatus is maintained to such a vacuum degree that exposure light will not attenuate. Gases mainly containing water and a carbon-based substance remain in the vacuum atmosphere in the exposure apparatus. The residual gases include a gas generated by a member, such as a cable used in the exposure apparatus, and a gas volatilizing from a resist applied on a wafer.

The residual gas components repeat physical adsorption in the surface of the optical element used in the exposure apparatus and desorption from it. The time duration of adsorption in the optical element surface varies depending on the substances, and ranges from a minimum of several tens of picoseconds to a maximum of several thousand seconds. Usually, the residual gas components merely adsorb physically, and neither chemically combine with the optical element surface nor cause a reaction.

When, however, EUV light irradiates the optical element, secondary electrons are generated on the optical element surface to dissociate the residual gas components that have adsorbed in the optical element surface. Particularly, when water has been physically adsorbed, active substances, such as oxygen radicals or hydroxide radicals generated by the dissociation, react on the optical element surface to undesirably oxidize it.

When the optical element surface oxidizes, it degrades the performance of the optical element, to decrease the throughput. Particularly, in an EUV exposure apparatus, if the optical element is a reflective multi-layer mirror, oxidation of the uppermost layer by merely several nm leads to a decrease in reflectance. In the EUV exposure apparatus, even a slight decrease in reflectance of each multi-layer mirror may adversely affect the throughput of the exposure apparatus very largely. If surface oxidation occurs locally, it causes nonuniform illuminance to degrade the image performance of the exposure apparatus.

To prevent the surface oxidation, a method of forming a capping layer, which covers the surface of the multi-layer mirror, has been proposed. As the material of the capping layer, a more inactive material should be selected. For example, groups including diamond-like carbon, boron nitride, boron carbide, silicon nitride, silicon carbide, B, Pd, Ru, Rh, Au, $MgF_2$, LiF, $C_2F_4$, and TiN, and their compounds and alloys are useful (see, for example, Japanese Patent Laid Open No. 2001-59901 that corresponds to U.S. Pat. No. 6,449,086 B1). By using such a resistant material to form the capping layer, the oxidation resistance can improve.

Formation of a capping layer on the optical layer in order to prevent surface oxidation is an effective way to prevent degradation of the optical element so as to prolong the service life of the optical element. It is, however, very difficult to prevent surface oxidation of the optical element semipermanently, to maintain the performance of the exposure apparatus.

Once the optical element oxidizes, it cannot be restored. Hence, to prolong the service life of the optical element, it is indispensable to avoid oxidation.

Particularly, when the capping layer is made of a substance which decreases by oxidation, oxidation of an underlying layer is also likely to progress. For example, when the capping layer is a carbon film, oxidized carbon forms carbon dioxide, carbon monoxide, or the like, to decrease the carbon content of the film. When the carbon film becomes thin or less dense, not only do the optical characteristics change due to the carbon film, but also, oxidation of the underlying layer is likely to progress.

SUMMARY OF THE INVENTION

The present invention has been made in view of the above problem, and has as its object to provide, for example, an exposure apparatus with a function of repairing the capping layer of an optical element to prevent degradation of the optical element, thereby prolonging the service life of the optical element.

The first aspect of the present invention relates to an exposure apparatus, which comprises a chamber where an optical element including a capping layer is arranged, and which exposes a substrate by using the optical element, comprising a supply unit which supplies a material into the chamber to repair the capping layer, and a providing unit which provides electromagnetic waves to the optical element. In the exposure apparatus, the electromagnetic waves cause a photochemical reaction of the material to grow a layer on the capping layer so as to repair the capping layer.

According to a preferred embodiment of the present invention, preferably, the exposure apparatus includes an exposure mode to expose the substrate and a repair mode to repair the capping layer. In the repair mode, preferably, the supply unit supplies the material into the chamber and the providing unit provides the electromagnetic waves to the optical element.

According to another preferred embodiment of the present invention, preferably, the providing unit includes an irradiation condition adjusting unit which adjusts an irradiation condition under which the optical element is irradiated with the electromagnetic waves. The irradiation condition relates to at least one of, e.g., a wavelength, an irradiation intensity, and an irradiation region of the electromagnetic waves.

According to still another preferred embodiment of the present invention, preferably, the supply unit includes a supply condition adjusting unit, which adjusts a supply condition under which the material is supplied to the optical element. The supply condition relates to at least one of, e.g., a position and a region of the optical element to which the material is supplied from the supply unit into the chamber, and a type and an amount of the material.

According to still another preferred embodiment of the present invention, preferably, the exposure apparatus further comprises a measurement unit which measures a state of the capping layer, and a control unit, which controls operation to repair the capping layer on the basis of a measurement result of the measurement unit.

According to still another preferred embodiment of the present invention, preferably, the control unit determines a repair condition for the capping layer on the basis of the measurement result of the measurement unit.

According to still another preferred embodiment of the present invention, for example, the control unit checks completion of the repair of the capping layer on the basis of the measurement result of the measurement unit.

According to still another preferred embodiment of the present invention, the electromagnetic waves can comprise light generated by a light source that generates exposure light to expose the substrate.

According to still another preferred embodiment of the present invention, the measurement unit can be configured to measure a state of the capping layer by using measurement light. The electromagnetic waves and the measurement light can comprise light generated by a light source that generates exposure light to expose the substrate.

According to still another preferred embodiment of the present invention, for example, the light source comprises an EUV light source. The EUV light source can generate light having a wavelength falling within a range not less than 11 nm and not greater than 15 nm.

According to still another preferred embodiment of the present invention, the capping layer can be made of carbon.

According to still another preferred embodiment of the present invention, the material can comprise a carbon containing substance.

According to still another preferred embodiment of the present invention, preferably, a gas partial pressure of the carbon containing substance in the chamber is controlled to fall within a range not less than $1.5\times10^{-8}$ Pa and not greater than $1.0\times10^{-2}$ Pa.

The second aspect of the present invention relates to a control method for an exposure apparatus comprising a chamber where an optical element including a capping layer is arranged, comprising the steps of supplying a material into the chamber to repair the capping layer and providing electromagnetic waves to the optical element that cause a photochemical reaction of the material so as to grow a layer on the capping layer, thereby repairing the capping layer.

The third aspect of the present invention relates to a device manufacturing method comprising the steps of exposing a substrate by using an exposure apparatus as described above, and developing the substrate.

The fourth aspect of the present invention relates to a device manufacturing method comprising the steps of exposing a substrate by an exposure apparatus, which comprises a chamber where an optical element including a capping layer is arranged, and which exposes the substrate by using the optical element, supplying a material to repair the capping layer into the chamber and providing electromagnetic waves to the optical element that cause a photochemical reaction of the material so as to grow a layer on the capping layer, thereby repairing the capping layer.

According to the present invention, for example, by providing the exposure apparatus with the function of repairing the capping layer of the optical element, degradation of the optical element can be prevented to prolong the service life of the optical element.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
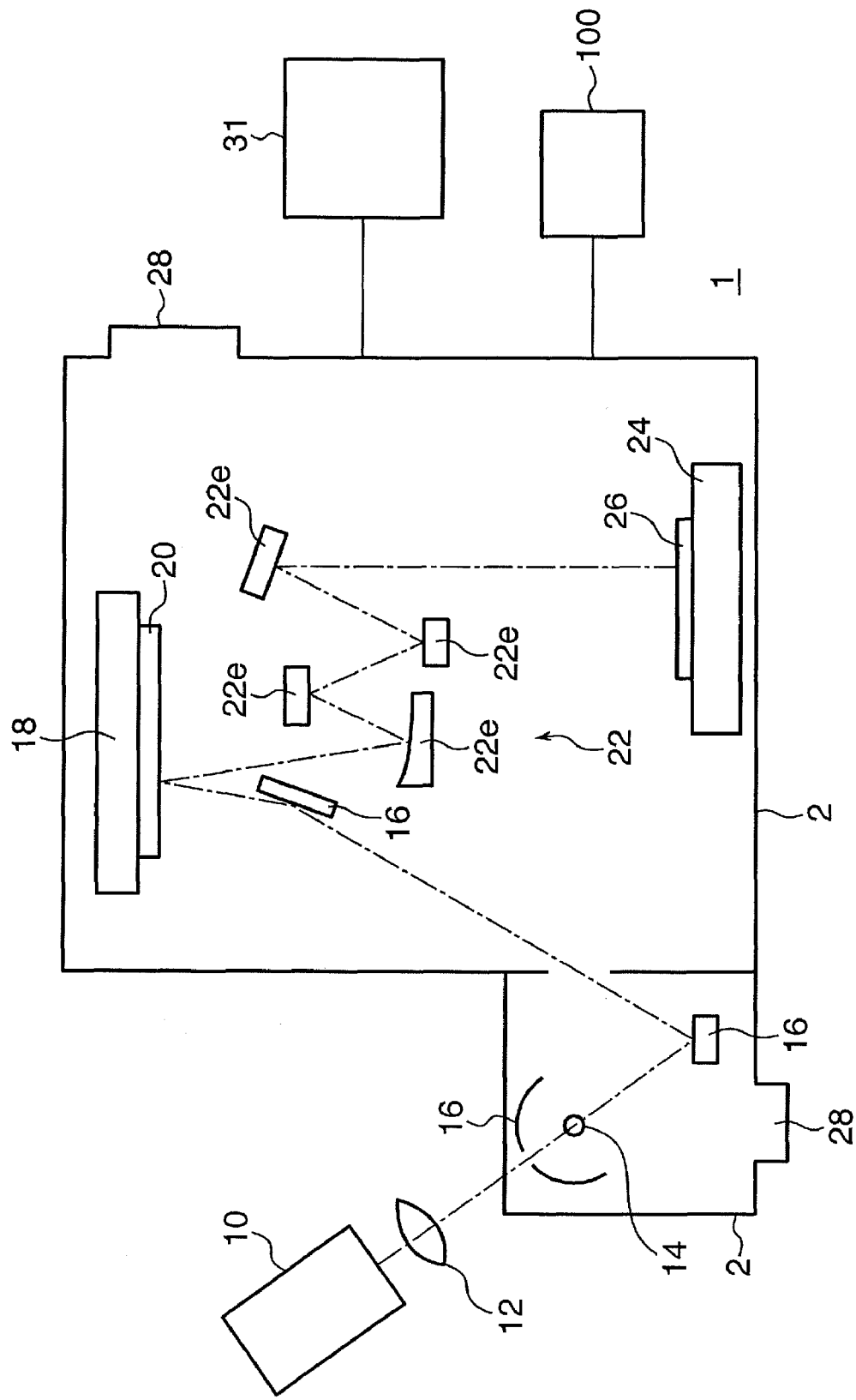
FIG. 1 is a view schematically showing an example of the overall arrangement of an EUV exposure apparatus according to a preferred embodiment of the present invention.

Preferred embodiments of the present invention will be described with reference to the accompanying drawings. In the drawings, the same reference numerals denote the same members.

An exposure apparatus according to the present invention is suitable, in the manufacturing process of, e.g., a semiconductor device, such as an LSI or CCD, an LCD, a magnetic sensor, and a thin film magnetic head, to transfer a pattern on an original onto a substrate coated with a photosensitive agent with exposure light.

An exposure apparatus according to a preferred embodiment of the present invention will be described. FIG. 1 is a view schematically showing an example of the overall arrangement of an EUV exposure apparatus according to a preferred embodiment of the present invention. An EUV exposure apparatus 1 comprises a vacuum chamber 2 in which one or a plurality of optical elements each having a capping layer are arranged, and which exposes a substrate by using the optical elements.

A condenser lens 12 focuses a laser beam, emerging from a laser 10, to a focal point. At the focal point, the laser beam excites a target gas to form a plasma spot 14. An illumination optical system 16 guides EUV light radiated from the plasma spot 14 to a reflective reticle (reflective original) 20 having a desired pattern. The EUV light reflected by the reticle 20 projects the pattern on the reticle 20 onto a photosensitive agent on a wafer (substrate) 26 through a projection optical system 22 comprising optical elements 22e. The reticle 20 and wafer 26 are respectively fixed to a reticle stage 18 and wafer stage 24, both of which can translate. The EUV exposure apparatus 1 can obtain a higher resolution because its exposure light has a wavelength shorter than that of ultraviolet rays. As the EUV light source, other than the laser plasma light source as described above, a synchrotron radiation light source, a discharge plasma light source, or the like, may be used.

The optical element serving as the constituent element of each of the reticle 20, the illumination optical system 16, the projection optical system 22, and the like, is formed by coating a multi-layer film obtained by alternately stacking two substances that have different refractive indices in the wavelength range of, e.g., EUV light. An example of the structure of the multi-layer film can include a structure obtained by stacking approximately 30 to 40 pairs of Mo and Si and forming a capping layer formed of carbon as the uppermost layer.

In the exposure apparatus 1, the wafer 26, reticle 20, illumination optical system 16, projection optical system 22, reticle stage 18, wafer stage 24, and the like, are arranged in the vacuum chamber 2. An exhaust unit 28, such as a vacuum pump, evacuates the vacuum chamber 2 to prevent attenuation of the EUV light by the external atmosphere, such as the atmosphere, and scattering of photoelectrons. The exhaust unit 28 can include, e.g., a turbo-molecular pump or an ion pump.

To repair the capping layer formed on the surface of the optical element serving as the constituent element of e.g., the reticle 20, illumination optical system 16, or projection optical system 22, a supply unit 31 supplies a carbon containing substance into the vacuum chamber 2, and, preferably, to the vicinity of the surface of the optical element. The supply unit 31 or another device controls the gas partial pressure of the carbon containing substance in the vacuum chamber 2 to an optimal gas partial pressure within a range of, e.g., $1.5 \times 10^{-8}$ Pa or more to $1.0 \times 10^{-2}$ Pa or less.

The amount of carbon containing substance that the supply unit 31 is to supply into the vacuum chamber 2 can be controlled by controlling the flow rate of the carbon containing substance to be introduced into the vacuum chamber 2 by using, e.g., differential pumping. Alternatively, in place of this, another method may be used. It is desirable to measure the component that forms the atmosphere in the vacuum chamber 2, i.e., the residual gas component in the vacuum, by a measurement unit such as a quadrupole mass spectrometer. This enables control of the partial pressure of the carbon containing substance that the supply unit 31 is to supply into the vacuum chamber 2 stably and accurately, over a long period of time.

The carbon containing substance that the supply unit 31 has introduced into the vacuum chamber 2 repeats physical absorption in the surface of the optical element and desorption from it. The time duration that the carbon containing substance stays on the optical element surface by one adsorption varies depending on the substances, and ranges from a minimum of several tens of picoseconds to a maximum of several thousand seconds. When introducing a substance which stays on the optical element surface for a short period of time of several tens of picoseconds by one adsorption, secondary electrons generated on the optical surface element as EUV light irradiates the optical element will dissociate the substance at a low probability, and the substance will not readily attach as carbon to the optical element surface. Conversely, when introducing a substance which stays on the optical element surface for a long period of time of several thousand seconds by one adsorption, secondary electrons generated on the optical surface element as the EUV light irradiates the optical element will dissociate the substance at a high probability, and the substance will readily attach as carbon to the optical element surface. Namely, controlling of the type and supply amount of the substance to be supplied also can change the carbon deposition speed on the optical element surface. Therefore, controlling of the gas partial pressure of the carbon containing substance in the vacuum chamber 2 can easily control the amount of carbon depositing on the optical element surface. For example, by selecting a substance having a short surface adsorption time and controlling its partial pressure, a very thin carbon film can be formed with high controllability.

According to this embodiment, the supply unit 31 controls the gas partial pressure of the carbon containing substance in the vacuum chamber 2, such that a very thin carbon film is always formed on the optical element. If a thick carbon film is deposited on the optical element, it decreases the reflectance of the optical element. A very thin carbon film does not decrease the reflectance of the optical element that may pose a problem in the exposure apparatus. Oxidation by water mainly consumes the very thin carbon film formed on the optical element surface. If water physically adsorbs to the surface of the optical element having a carbon film and EUV light irradiates the water, the water dissociates to generate an active substance. It is said that the active substance reacts with carbon to generate carbon monoxide or carbon dioxide. Therefore, the gas partial pressure of the carbon containing substance may be controlled such that the carbon deposition speed and the consumption speed of deposited carbon maintain equilibrium with a very thin carbon film being formed on the optical element.

If the gas partial pressure of the carbon containing substance is less than $1.5 \times 10^{-8}$ Pa, the partial pressure of water becomes excessive in the vacuum chamber 2, to lead to an atmospheric condition under which carbon desorption or oxidization is more likely to occur on the optical element surface than carbon attaching. Hence, carbon will not deposit, but oxidation consumes the optical element surface undesirably. As described above, once the optical element surface oxidizes, it cannot be restored. Hence, oxidation must always be avoided. Accordingly, the gas partial pressure of the carbon containing substance is desirably $1.5 \times 10^{-8}$ Pa or more.

If the gas partial pressure of the carbon containing substance becomes $1.0 \times 10^{-2}$ Pa or more, the amount of carbon containing substance in the light path of the vacuum chamber 2 increases greatly, and the EUV light absorption amount of the substance becomes non-negligible. If the carbon containing substance absorbs the EUV light, the transmittance of the EUV light decreases to decrease the throughput.

Figure 2:
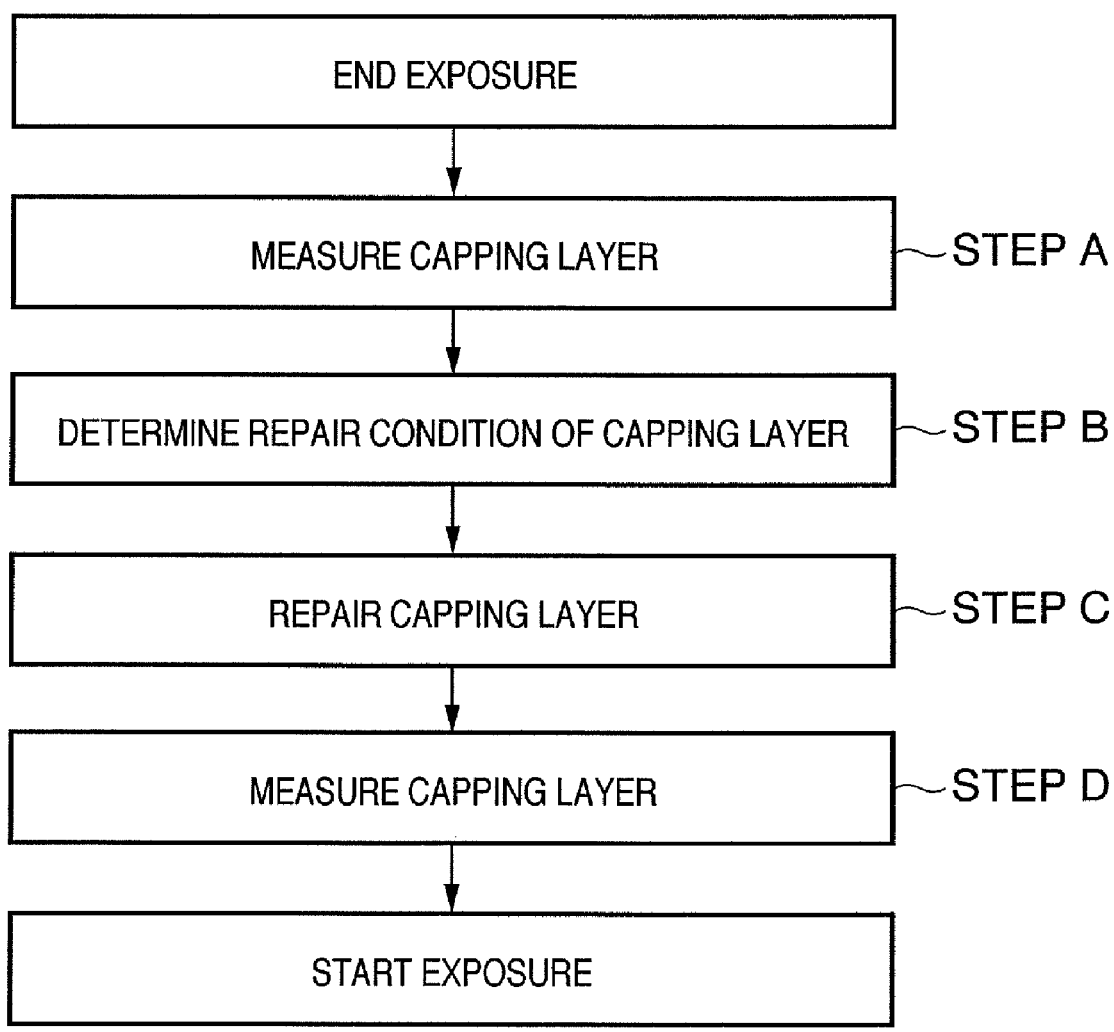
FIG. 2 is a flowchart showing the control sequence of the exposure apparatus, which concerns repair of a capping layer.
Figure 3:
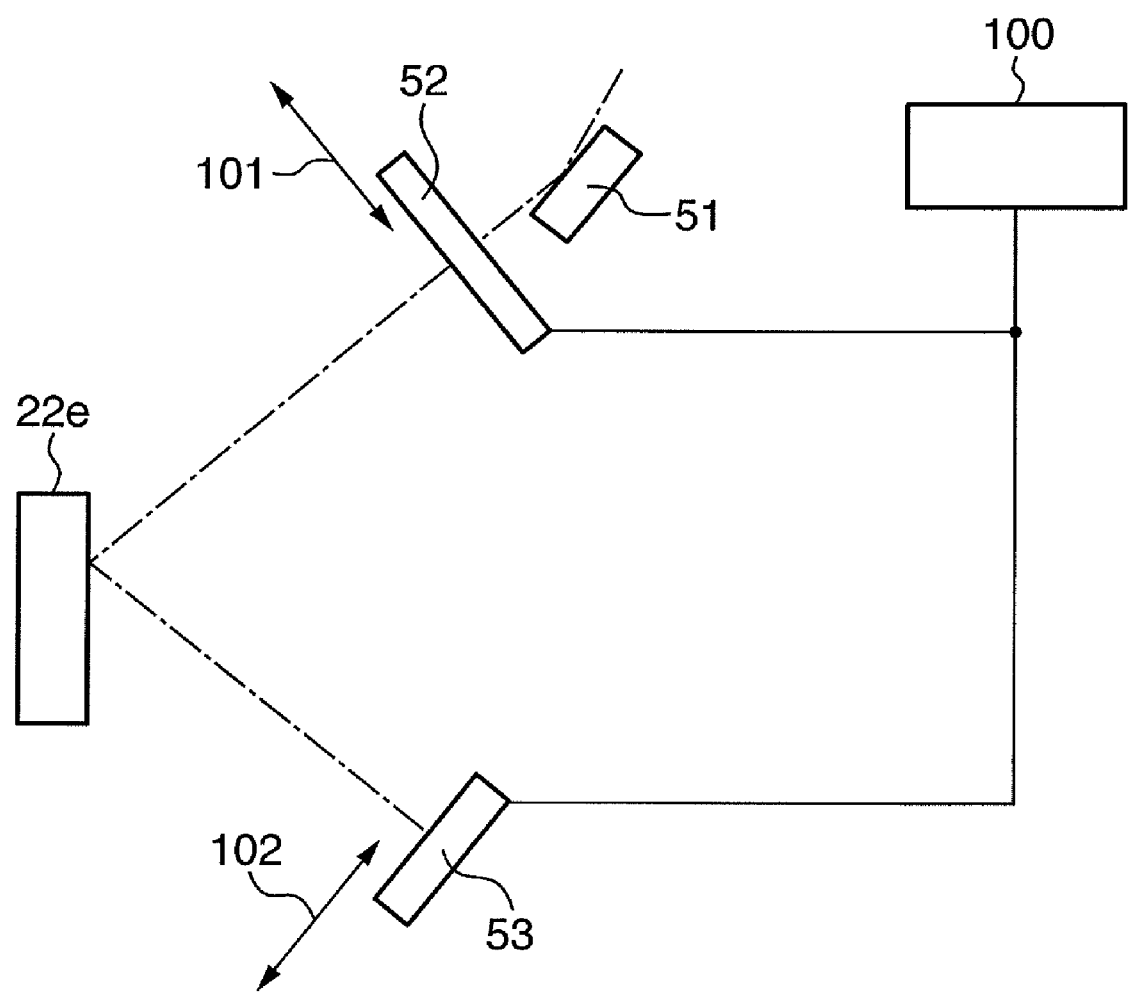
FIG. 3 is a view schematically showing an example of the arrangement of a measurement system, which measures the capping layer of an optical element that constitutes a projection optical system.
Figure 4:
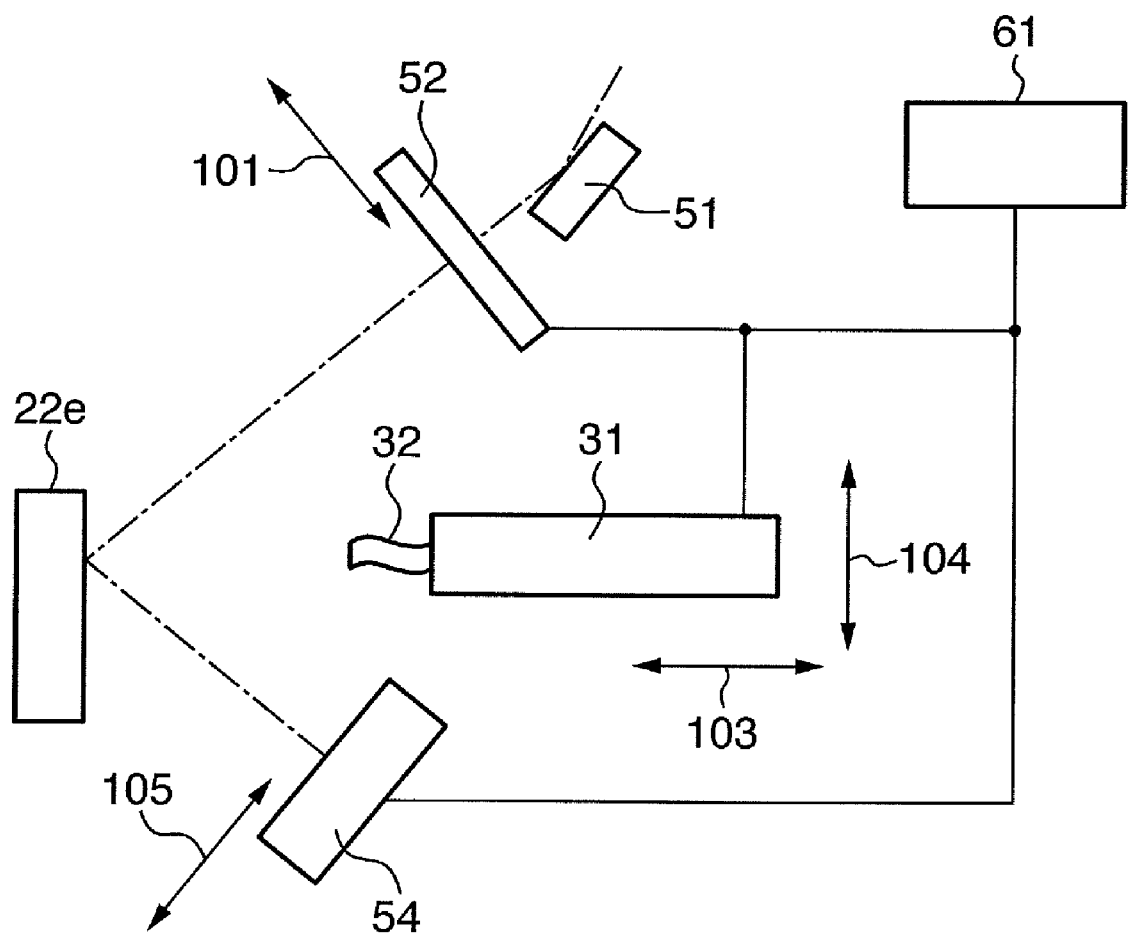
FIG. 4 is a view for explaining repair of the capping layer.

Repair of the capping layer will be described hereafter in more detail. FIG. 2 is a flowchart showing the control sequence of the exposure apparatus which concerns repair of the capping layer. A controller 100 performs this control sequence. FIG. 3 is a view schematically showing an example of the arrangement of a measurement system, which measures the capping layer of an optical element that constitutes the projection optical system 22. FIG. 4 is a view for explaining repair of the capping layer.

The exposure apparatus includes an exposure mode and a repair mode. Alternately, a control method for the exposure apparatus includes an exposure step and a repair step. After the exposure mode (exposure step) ends, in step A, the state of the capping layer of the optical element 22e is measured. A measurement example of the optical element will be described with reference to FIG. 3. The example shown in FIG. 3 uses EUV light provided by an EUV light source, which generates exposure light, as measurement light. In measurement, the controller 100 moves a mirror 51, aperture 52, and a sensor 53, which are set outside the light path, to the light path by a driving mechanism (not shown).

Under the control of the controller 100, the aperture 52 is driven while translating and/or rotatably driving the mirror 51, so area regulated light can scan the surface of the optical element 22e of the projection optical system 22. For example, the controller 100 can control the movement of the mirror 51, aperture 52, and sensor 53, so that the sensor 53 interlocks with the movement of the aperture 52, as indicated by an arrow 101, and moves as indicated by an arrow 102. This allows measurement of the reflectance of the optical element 22e at each position.

In step B, the controller 100 determines the repair condition of the capping layer. The repair condition can include an irradiation condition under which electromagnetic waves irradiate the optical element, and/or a supply condition under which a repair material (carbon containing substance) is supplied to the optical element. On the basis of, e.g., the reflectance data measured in step A, the controller 100 calculates the amount (thickness) of the capping layer to be replenished (deposited) at each position of the optical element 22e from the relationship between a known reflectance and the state of the capping layer. On the basis of the calculated amount of the capping layer, the controller 100 determines the repair condition, under which the capping layer is to be repaired, in the next step C, for each position of the optical element 22e.

The irradiation condition of the electromagnetic waves relates to, e.g., the irradiation intensity, irradiation region, and irradiation time of the electromagnetic waves. The supply condition of the repair material relates to, e.g., the position (position where the substance is supplied to the optical element) of a supply port 32 and a scanning pattern, a distance (a region where the substance is supplied to the optical element) between the supply port 32 and the optical element, the type of material to be supplied from the supply port 32, and the substance supply amount. This allows appropriate repair of the capping layer at each position of the optical element 22e.

In step C, the controller 100 repairs the capping layer of the optical element 22e in accordance with the repair condition determined in step B. In the example shown in FIG. 4, as electromagnetic waves to repair the capping layer, EUV light with an irradiation intensity and irradiation region, at least one of which is different from that in the exposure mode, is provided to the optical element 22e by using the mirror 51 and aperture 52. The EUV light source, which generates exposure light, supplies the EUV light to the mirror 51. The driving mechanism (not shown) controlled by the controller 100 drives the mirror 51 and aperture 52. The supply unit 31 supplies the carbon containing substance (repair material) to the vicinity of the surface of the capping layer formed on the optical element 22e. The electromagnetic waves provided by the mirror 51 and aperture 52 to the capping layer of the optical element 22e make the carbon containing substance cause a photochemical reaction. This grows a layer on the capping layer to repair it. Namely, the capping layer becomes thin due to oxidation, or the like. The decreased film thickness is replenished, and repaired in the repair mode.

During the exposure, the supply port 32 is located outside the light path. When repairing the capping layer, the driving mechanism (not shown) moves the supply port 32 to the vicinity of the optical element 22e, as indicated by an arrow 103, under the control of the controller 100. When repairing the capping layer, the driving mechanism (not shown) moves the supply port 32 in, e.g., two-axis directions (for example, in the direction of the arrow 103 and that of an arrow 104) to scan the optical element 22e with the repair material. Namely, the supply unit 31, the driving mechanism which drives the supply port 32 of the supply unit 31, and furthermore, the controller 100, which controls the supply unit 31, the supply port 32, and the driving mechanism, constitute a supply condition adjusting unit, which adjusts the supply condition when supplying the repair material to the optical element.

The EUV light source can adjust the irradiation intensity of the EUV light to make the repair material to cause the photochemical reaction by, e.g., changing the output of the laser 10. It is also possible to change the irradiation intensity by controlling the mirror 51 and aperture 52. Regarding the irradiation region, the controller 100 moves the mirror 51 and aperture 52 to change the light path, so light irradiates only the region to be irradiated. By selecting the irradiation region in this manner, the capping layer can be replenished (deposited) by a desired amount in accordance with the decreased amount of the capping layer at each position of the optical element 22e. Namely, the EUV light source, the driving mechanism of the mirror 51 and aperture 52, and the controller 100, which controls the EUV light source and driving mechanism, constitute an irradiation condition adjusting unit which adjusts the irradiation condition when irradiating the optical element with the electromagnetic waves.

To prevent the electromagnetic waves used to repair the capping layer from being reflected or scattered to adversely affect the exposure apparatus, the controller 100 controls the position of a stopper 54. This prevents the electromagnetic waves from being reflected or scattered around. The carbon containing substance can be supplied from the supply port 32 while controlling the position and posture of the supply port 32, mirror 51, and aperture 52, so as to scan the entire surface of the optical element 22e. Conditions such as the irradiation intensity, irradiation region, and irradiation time of the electromagnetic waves, the position of the supply port 32, the scanning pattern, the type and supply amount of the substance to be supplied from the supply port 32, and the like, follow the condition determined in step B.

In step D, the capping layer is measured to check if the capping layer is appropriately repaired in step C. The controller 100 measures the state of the capping layer of the optical element 22e in the same manner as in step A. When it is confirmed that the capping layer is repaired appropriately, the mirror 51, aperture 52, sensor 53, and the like, are restored to the ordinary exposure position, and exposure is started. If the capping layer is repaired inappropriately, the process returns to step B.

Although the present invention has been exemplified by the repair of the capping layer of the optical element 22e, which forms the projection optical system 22, the present invention can also be applied to repair of the capping layer of the optical element that forms the illumination optical system 16, or another optical element. In the description, the capping layer is a carbon layer, and an arrangement that supplies the carbon containing substance has been described. However, the capping layer is not limited to this, and the present invention can be applied to a capping layer made of another substance.

Steps A and D describe a case of measuring the capping layer. If the degree of decrease of the capping layer is predictable, step A can be omitted. If the capping layer is repaired stably with a good reproducibility, evaluation and checking in step D can be omitted.

Figure 5:
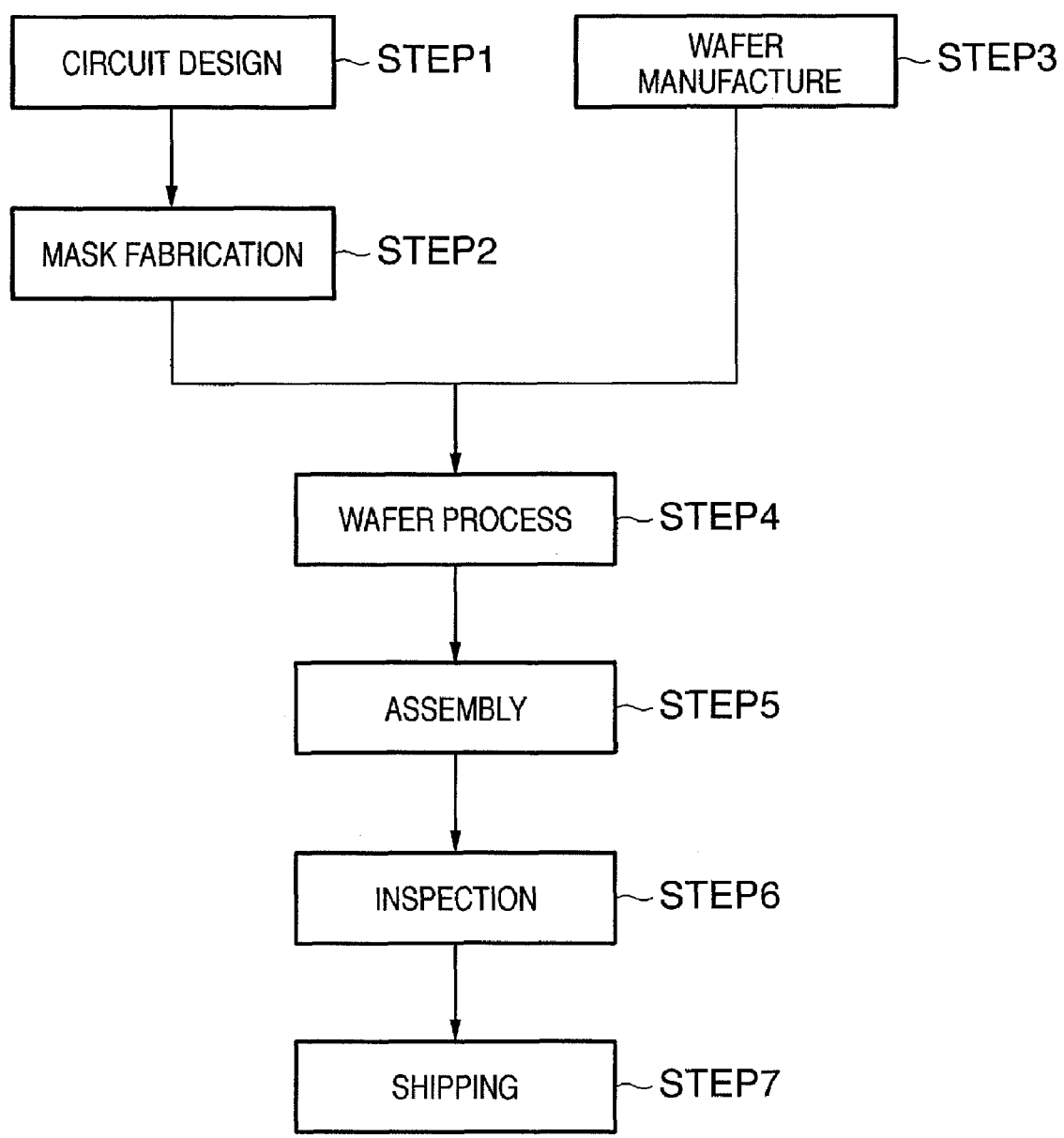
FIG. 5 is a flowchart to explain device manufacture.

An embodiment of a device manufacturing method, which utilizes the exposure apparatus, will be described with reference to FIGS. 5 and 6. FIG. 5 is a flowchart to describe the manufacture of a device (e.g., a semiconductor chip, such as an LSI or VLSI, a CCD, an LCD, a magnetic sensor, a thin film magnetic sensor, or the like). A description will be made by taking the manufacture of a semiconductor chip as an example. In step 1 (circuit design), the circuit of a device is designed. In step 2 (mask fabrication), a mask having the designed circuit pattern is fabricated. In step 3 (wafer manufacture), a wafer is manufactured using a material such as silicon. In step 4 (wafer process), called a pre-process, an actual circuit is formed on the wafer using the mask and wafer by lithography. In step 5 (assembly), called a post-process, a semiconductor chip is formed using the wafer formed in step 4. This step includes processes, such as assembly (dicing and bonding) and packaging (chip encapsulation). In step 6 (inspection), inspections including an operation check test and a durability test of the semiconductor device formed in step 5 are performed. The semiconductor device is finished with these steps and shipped (step 7).

Figure 6:
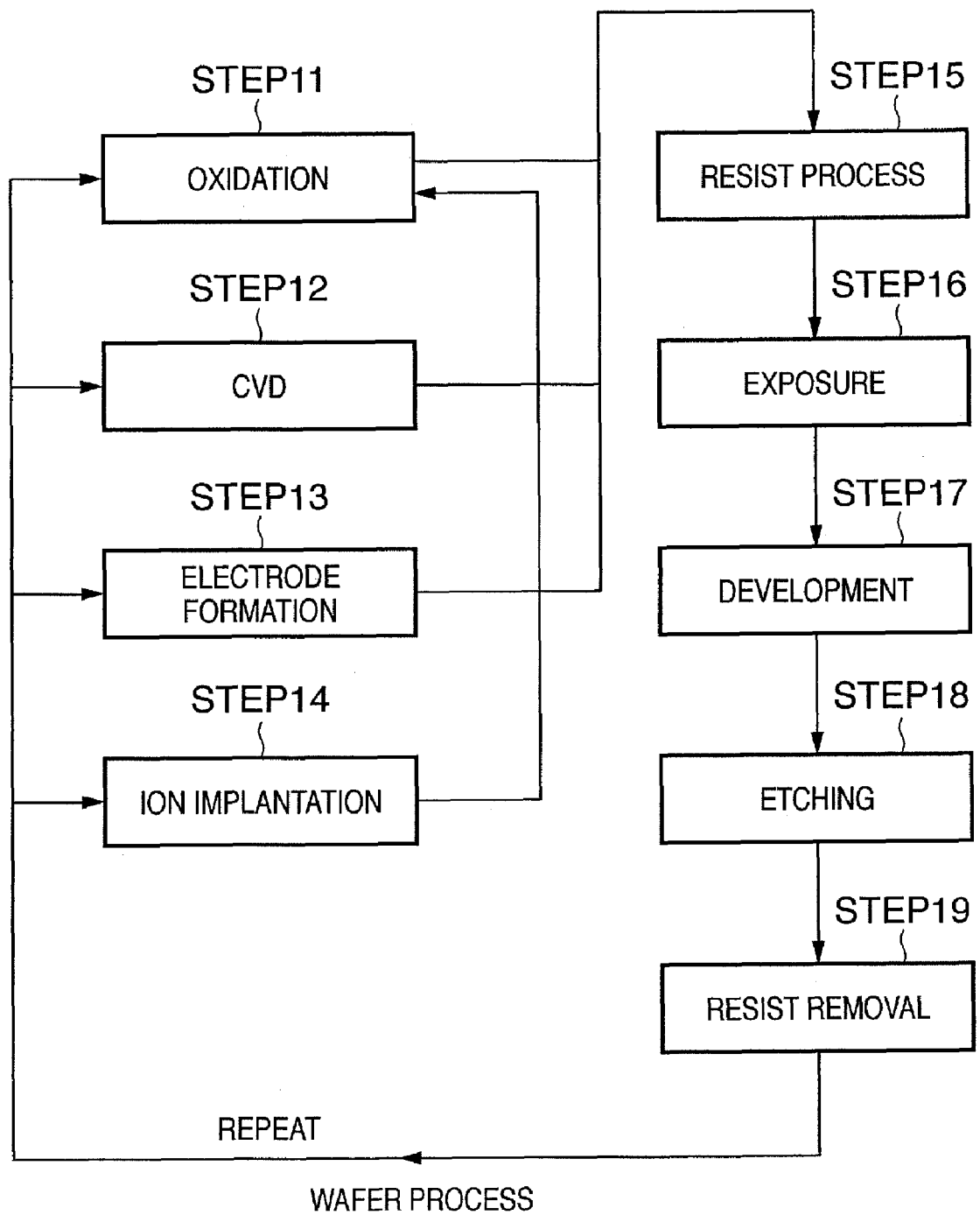
FIG. 6 is a detailed flowchart of the wafer process of step 4 shown in FIG. 5.

FIG. 6 is a detailed flowchart of the wafer process of step 4. In step 11 (oxidation), the surface of the wafer is oxidized. In step 12 (CVD), an insulating film is formed on the wafer surface. In step 13 (electrode formation), an electrode is formed on the wafer by deposition, or the like. In step 14 (ion implantation), ions are implanted into the wafer. In step 15 (resist process), a photosensitive agent is applied to the wafer. In step 16 (exposure), the exposure apparatus exposes the circuit pattern on the mask onto the wafer. When the planned exposure job is ended, the exposure apparatus is switched from the exposure mode to the repair mode, so it can repair the capping layer.

In step 17 (development), the exposed wafer is developed. In step 18 (etching), portions other than the developed resist image are etched. In step 19 (resist removal), an unnecessary resist after etching is removed. These steps are repeated to form multiple circuit patterns on the wafer. The device manufacturing method according to this embodiment can manufacture a higher-quality device than a conventional device made by a conventional method. In this manner, the device manufacturing method employed by the exposure apparatus, and a device as a resultant product, also constitute aspects of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus that comprises a chamber, in which a projection optical system that includes an optical element having a capping layer is arranged, the apparatus exposing a substrate to EUV light via the optical element, the apparatus comprising:
    a supply unit configured to supply a material into the chamber; and
    a providing unit configured to provide the EUV light to the capping layer, the providing unit including an aperture configured to be moved onto a path of the EUV light from outside of the path and to be moved, on the path, so that the capping layer is scanned with the EUV light, the providing unit including a sensor configured to be moved with the aperture to measure a reflectance at each position of the capping layer,
    wherein the apparatus is configured so that the EUV light provided by the providing unit via the aperture causes a photochemical reaction of the material, to grow a layer on the capping layer, with at least one of a condition of supply of the material by the supply unit and a condition of provision of the EUV light by the providing unit being changed with respect to each position of the capping layer based on the measured reflectance at each position of the capping layer, so as to repair the capping layer.

2. The apparatus according to claim 1, wherein the apparatus has, as an operation mode, an exposure mode to expose the substrate to the EUV light and a repair mode to repair the capping layer, and the apparatus is configured so that the supply unit supplies the material into the chamber and the providing unit provides the EUV light to the capping layer in the repair mode.

3. The apparatus according to claim 1, wherein the providing unit includes an adjusting unit configured to adjust the condition of the provision of the EUV light.

4. The apparatus according to claim 3, wherein the condition relates to at least one of an irradiation intensity of the EUV light and an irradiation time of the EUV light.

5. The apparatus according to claim 1, wherein the supply unit includes an adjusting unit configured to adjust the condition of supply of the material.

6. The apparatus according to claim 5, wherein the condition relates to at least one of a position of a supply port included in the supply unit and configured to supply the material, a scanning pattern of the supply port, a type of the material, and an amount of the material.

7. The apparatus according to claim 1, further comprising a light source configured to generate the EUV light.

8. The apparatus according to claim 7, further comprising a control unit configured to determine the condition of supply of the material and the condition of provision of the EUV light, based on the measured reflectance at each position of the capping layer.

9. The apparatus according to claim 8, wherein the control unit is configured to determine whether repair of the capping layer is completed based on an output of the sensor.

10. The apparatus according to claim 7, wherein the light source is configured to generate, as EUV light, light having a wavelength within a range of not less than 11 nm and not greater than 15 nm.

11. The apparatus according to claim 1, wherein the capping layer is made of carbon.

12. The apparatus according to claim 11, wherein the material includes a carbon containing substance.

13. The apparatus according to claim 12, wherein the supply unit is configured to supply the material so that a gas partial pressure of the carbon containing substance in the chamber is within a range of not less than $1.5 \times 10^{-8}$ Pa and not greater than $1.0 \times 10^{-2}$ Pa.

14. A method of manufacturing a device, the method comprising:
    exposing a substrate to exposure light using an exposure apparatus defined in claim 1;
    developing the exposed substrate; and
    processing the developed substrate to manufacture the device.

15. The method according to claim 14, wherein stopping of the EUV light being reflected or scattered by the capping layer is performed with a stopper configured to be moved with the aperture.

16. The apparatus according to claim 1, wherein the providing unit includes a stopper configured to be moved with the aperture and to stop the EUV light reflected or scattered by the capping layer.

17. A control method for an exposure apparatus that comprises a chamber, in which a projection optical system that includes an optical element having a capping layer is arranged, the apparatus exposing a substrate to EUV light via the optical element, the method comprising:

supplying a material into the chamber; and providing EUV light to the capping layer, the providing of the EUV light being performed via an aperture configured to be moved onto a path of the EUV light from outside of the path and to be moved, on the path, so that the capping layer is scanned with the EUV light, measurement of a reflectance at each position of the capping layer being performed via a sensor configured to be moved with the aperture, wherein the EUV light provided via the aperture causes a photochemical reaction of the supplied material to grow a layer on the capping layer, with at least one of a condition of supply of the material and a condition of provision of the EUV light being changed with respect to each position of the capping layer, based on the measured reflectance at each position of the capping layer, so as to repair the capping layer.

18. The method according to claim 17, wherein stopping of the EUV light being reflected or scattered by the capping layer is performed with a stopper configured to be moved with the aperture.

19. A method of manufacturing a device, the method comprising:

exposing a substrate to EUV light using an exposure apparatus that comprises a chamber, in which a projection optical system that includes an optical element having a capping layer is arranged, the apparatus exposing the substrate to the EUV light via the optical element;

supplying a material into the chamber; and providing EUV light to the capping layer, the providing of the EUV light being performed via an aperture configured to be moved onto a path of the EUV light from outside of the path and to be moved, on the path, so that the capping layer is scanned with the EUV light, measurement of a reflectance at each position of the capping layer being performed via a sensor configured to be moved with the aperture, wherein the EUV light provided via the aperture causes a photochemical reaction of the supplied material to grow a layer on the capping layer, with at least one of a condition of supply of the material and a condition of provision of the EUV light being changed with respect to each position of the capping layer, based on the measured reflectance at each position of the capping layer, so as to repair the capping layer.

20. The method according to claim 19, wherein stopping of the EUV light being reflected or scattered by the capping layer is performed with a stopper configured to be moved with the aperture.

* * * * *